US 9,787,295 B2

(12) United States Patent
Won et al.

(10) Patent No.: US 9,787,295 B2
(45) Date of Patent: Oct. 10, 2017

(54) POWER SUPPLY CIRCUIT FOR GATE DRIVER AND GATE DRIVER CIRCUIT OF FLOATING SWITCH HAVING THE SAME

(71) Applicant: RESEARCH & BUSINESS FOUNDATION SUNGKYUNKWAN UNIVERSITY, Suwon-si (KR)

(72) Inventors: Chung Yuen Won, Gwacheon-si (KR); Jong Mu Lee, Seoul (KR); Song Wook Hyun, Seoul (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 0 days.

(21) Appl. No.: 15/098,437

(22) Filed: Apr. 14, 2016

(65) Prior Publication Data

US 2016/0301401 A1    Oct. 13, 2016

(30) Foreign Application Priority Data

Mar. 9, 2015    (KR) .......................... 10-2015-0032714

(51) Int. Cl.
| | |
|---|---|
| *H03K 5/08* | (2006.01) |
| *H03K 17/567* | (2006.01) |
| *H03K 17/74* | (2006.01) |
| *H02M 1/08* | (2006.01) |

(52) U.S. Cl.
CPC ............. *H03K 5/08* (2013.01); *H03K 17/567* (2013.01); *H03K 17/74* (2013.01); *H02M 1/08* (2013.01); *H03K 2217/0036* (2013.01); *H03K 2217/0063* (2013.01); *H03K 2217/0081* (2013.01)

(58) Field of Classification Search
CPC .......... H02M 1/00; H02M 1/08; H03K 17/00; H03K 17/04126; H03K 17/063; H03K 17/0826; H03K 17/601; H03K 17/74; H03K 2217/00; H03K 2217/0036; (Continued)

(56) References Cited

U.S. PATENT DOCUMENTS

| | | | | |
|---|---|---|---|---|
| 2013/0214757 | A1* | 8/2013 | Lee | .......... H03K 17/06 323/311 |
| 2013/0328597 | A1* | 12/2013 | Cassia | .......... G11C 5/145 327/109 |

FOREIGN PATENT DOCUMENTS

| | | |
|---|---|---|
| JP | 2006-311594 A | 11/2006 |
| KR | 10-2011-0085698 A | 7/2011 |

OTHER PUBLICATIONS

Korean Office Action dated Mar. 16, 2016 in counterpart Korean Appl. No. 10-2015-0032714 (24 pages in Korean).

* cited by examiner

*Primary Examiner* — Lincoln Donovan
*Assistant Examiner* — David Mattison
(74) *Attorney, Agent, or Firm* — NSIP Law

(57) ABSTRACT

Disclosed herein is a power supply circuit for a gate driver. The power supply circuit for the gate driver includes a negative voltage generator configured to generate a negative voltage by receiving an input voltage, wherein the negative voltage generator includes a tank capacitor configured to be charged by receiving the input voltage through a charge path, a discharge switch configured to form a discharge path when the tank capacitor is discharged, and a negative voltage generation capacitor arranged on the discharge path and configured to generate the negative voltage by storing electric charges discharged from the tank capacitor when the tank capacitor is discharged.

16 Claims, 2 Drawing Sheets

(58) Field of Classification Search
CPC ... H03K 2217/0063; H03K 2217/0081; H03K 5/00; H03K 5/08
USPC .......................................................... 327/109
See application file for complete search history.

POWER SUPPLY CIRCUIT FOR GATE DRIVER AND GATE DRIVER CIRCUIT OF FLOATING SWITCH HAVING THE SAME

CROSS-REFERENCE TO RELATED APPLICATION

This application claims priority to and the benefit of Korean Patent Application No. 10-2015-0032714, filed on Mar. 9, 2015, the disclosure of which is incorporated herein by reference in its entirety.

BACKGROUND

1. Field of the Invention

Embodiments of the present invention relate to a power supply circuit for a gate driver of a floating switch and a gate driver circuit of the floating switch having the same.

2. Discussion of Related Art

A conventional gate driver circuit is configured to provide a unipolar voltage to an upper switch gate driver and a lower switch gate driver to drive all of upper and lower switches.

A unipolar gate driver circuit according to the related art has difficulties including a parasitic current oscillation occurring upon a turn-on operation due to a high slew rate caused by a Miller capacitance of an insulated gate bipolar transistor (IGBT), an unintended turn-on phenomenon due to parasitic components, and the like.

To address such difficulties, a switching mode power supply (SMPS) for applying power supply to a gate driver should provide a wide range of voltages, or an additional circuit should be provided so as to form a negative gate voltage. As a result, power consumption due to the SMPS adopted in the gate driver is increased, a complicated circuit is needed, and a manufacturing cost is increased. Also, a Miller clamp circuit should be added so as to prevent the unintended turn-on phenomenon such that this is another factor to increase the manufacturing cost.

SUMMARY OF THE INVENTION

Therefore, embodiments of the present invention are provided to solve the disadvantages of the gate driver according to the related art described above. In other words, one of objectives of the present invention is to increase a rated power of an SMPS so as to provide a negative voltage, or provide a power supply circuit capable of supplying a negative voltage in concurrence with generating a positive voltage without adopting an additional circuit.

In accordance with one embodiment of the present invention, a power supply circuit for a gate driver includes a negative voltage generator configured to generate a negative voltage by receiving an input voltage, wherein the negative voltage generator includes a tank capacitor configured to be charged by receiving the input voltage through a charge path, a discharge switch configured to form a discharge path when the tank capacitor is discharged, and a negative voltage generation capacitor arranged on the discharge path and configured to generate the negative voltage by storing electric charges discharged from the tank capacitor when the tank capacitor is discharged.

In accordance with another embodiment of the present invention, a gate driver circuit of a floating switch includes a gate driver configured to drive a gate of the floating switch, and a power supply circuit configured to provide power supply to the gate driver, wherein the power supply circuit includes a positive voltage generator configured to generate a positive voltage by receiving an input voltage, and a negative voltage generator configured to generate a negative voltage by receiving the input voltage, wherein the negative voltage generator includes a tank capacitor configured to be charged by receiving the input voltage, a discharge switch configured to form a discharge path when the tank capacitor is discharged, and a negative voltage generation capacitor configured to generate the negative voltage by storing electric charges discharged from the tank capacitor when the tank capacitor is discharged.

In accordance with the embodiments of the present invention, an advantage capable of providing a negative voltage in concurrence with generating a positive voltage without increase of power consumption due to an SMPS circuit and provision of an additional circuit may be provided. Also, in accordance with the embodiments of the present invention, a floating switch may be controlled using the negative voltage such that another advantage without provision of a Miller clamp circuit may be provided.

BRIEF DESCRIPTION OF THE DRAWINGS

These and/or other aspects of the invention will become apparent and more readily appreciated from the following description of the embodiments, taken in conjunction with the accompanying drawings of which.

DETAILED DESCRIPTION OF EXEMPLARY EMBODIMENTS

Figure 1:
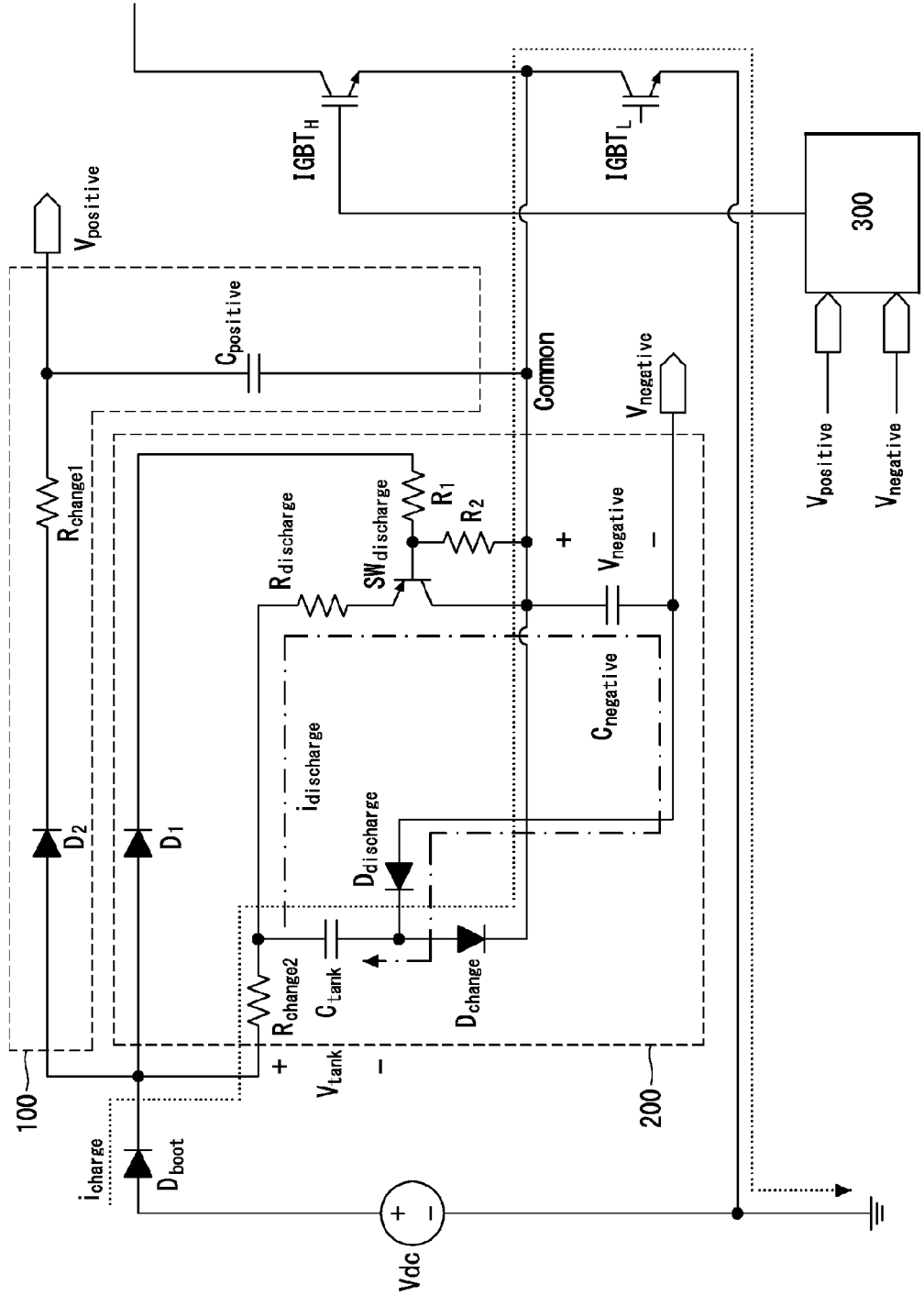
FIG. 1 is a schematic circuit diagram of a power supply circuit for a gate driver of a floating switch according to an embodiment of the present invention.

Since a description of the present invention is only intended for structural and functional description of the embodiments, the scope of the present invention is not to be construed as being limited by the embodiments described herein. That is, because the embodiments may vary and can have many different forms, the scope of the present invention should be understood to include equivalents for realizing the technical concept.

Meanwhile, the meanings of terms described herein should be understood as follows.

It will be understood that, although the terms first, second, etc. may be used herein to describe various elements, these terms are only used to distinguish one element from another, and the scope of the present invention should be not limited by these terms. For example, a first element could be termed a second element, and, similarly, a second element could be termed a first element.

As described herein, expression in the singular should be understood to include a plural meaning, unless there is a clearly different meaning in the context, and the terms of "comprise" and/or "include" and the like specify the presence of stated features, numbers, steps, operations, elements, parts, and/or a combination thereof, but do not preclude the presence or addition of one or more other features, numbers, steps, operations, elements, parts, and/or a combination thereof.

Each of steps may occur in a different order as set forth herein, unless explicitly described to a certain sequence. That is, each of the steps may be executed in the same sequence as set forth herein, or may be performed substantially concurrently, or may be performed in the reverse order.

Expression of "and/or" for explaining the embodiments of the present disclosure set forth herein is used to indicate each and all of components. For example, the description of "A and/or B" should be understood to indicate "A, B, and all of A and B."

In the accompanying drawings illustrating the embodiments of the present disclosure, the size, height, thickness and the like of a component may be exaggerated by design for ease of understanding and convenience of description, and may not be expanded or reduced according to a ratio. It will be further understood that one component illustrated in the drawing may be reduced by design, or another component therein may be expanded by design.

Unless otherwise defined, all terms used herein have the same meaning as commonly understood by those skilled in the art to which the invention pertains. General terms that are defined in a dictionary shall be construed to have meanings that are consistent in the context of the relevant art, and will not be interpreted as having an idealistic or excessively formalistic meaning unless clearly defined in the present application.

Hereinafter, the present embodiment according to the present invention will be described with reference to the accompanying drawings. FIG. 1 is a schematic circuit diagram of a power supply circuit for a gate driver of a floating switch according to the present embodiment. With reference to FIG. 1, the power supply circuit for the gate driver of the floating switch gate according to the present embodiment includes a positive voltage generator 100 for generating a positive voltage $V_{positive}$ by receiving an input direct-current (DC) voltage Vile, and a negative voltage generator 200 for generating a negative voltage $V_{negative}$ by receiving the input DC voltage $V_{dc}$, wherein the negative voltage generator 200 includes a tank capacitor $C_{tank}$ to be charged by receiving the input DC voltage $V_{dc}$ through a charging path, a discharge switch $SW_{discharge}$ forming a discharge path when the tank capacitor $C_{tank}$ is discharged, and a negative voltage generation capacitor $C_{negative}$ arranged on the discharge path and generating the negative voltage $V_{negative}$ by storing electric charges discharged from the tank capacitor $C_{tank}$.

The positive voltage generator 100 includes a positive voltage generation capacitor $C_{positive}$ for generating the positive voltage $V_{positive}$ by receiving the input DC voltage $V_{dc}$, and a first resistor $R_{charge1}$ for limiting a current when the positive voltage generation capacitor $C_{positive}$ is charged. The positive voltage generator 100 includes a blocking diode $D_2$, and the blocking diode $D_2$ prevents energy stored in the positive voltage generation capacitor $C_{positive}$ from flowing backward to consistently turn off the discharge switch $SW_{discharge}$.

The negative voltage generator 200 generates the negative voltage $V_{negative}$ capable of turning off an upper floating switch $IGBT_H$ in concurrence with generation of the positive voltage $V_{positive}$ by the positive voltage generator 100. The negative voltage generator 200 according to the present embodiment generates the negative voltage $V_{negative}$ capable of turning off the upper floating switch $IGBT_H$ without providing an additional circuit to a switching mode power supply (SMPS) that applies power supply to the gate driver.

When a lower floating switch $IGBT_L$ is turned on, a current (not shown) is supplied to the positive voltage generation capacitor $C_{positive}$ via a bootstrap diode $D_{boot}$, the blocking diode $D_2$, and the first resistor $R_{charge1}$ to generate the positive voltage $V_{positive}$, and simultaneously, a charge current $i_{charge}$ flows into a ground via a charge path shown in a dotted line, which is formed by the bootstrap diode $D_{boot}$, a second resistor $R_{charge2}$, the tank capacitor $C_{tank}$, a charge diode $D_{charge}$, and the lower floating switch $IGBT_L$, to cause energy storage in the tank capacitor $C_{tank}$, thereby generating a voltage $V_{tank}$.

Upon the charging, if the bootstrap diode $D_{boot}$, the charge diode $D_{charge}$, and the lower floating switch $IGBT_L$ serve as an ideal diode and an ideal switch to cause no forward voltage drop of a diode and no voltage drop when a switch is in a conducting state, a value of the voltage $V_{tank}$ charged in the tank capacitor $C_{tank}$ comes close to that of the input DC voltage $V_{dc}$. The second resistor $R_{charge2}$ limits the charge current $i_{charge}$ to prevent a rush current impulse from being supplied to the tank capacitor $C_{tank}$.

Upon charging the tank capacitor $C_{tank}$, the voltage $V_{tank}$ close to the input DC voltage $V_{dc}$ is applied to an emitter of the discharge switch $SW_{discharge}$ as the tank capacitor $C_{tank}$ is being charged. Since a resistor $R_1$ has a resistance value capable of limiting the charge current $i_{charge}$ and less than that of a resistor $R_2(R_1 \ll R_2)$, a voltage close to the input DC voltage $V_{dc}$ is applied to a base of the discharge switch $SW_{discharge}$ through a feedback blocking diode $D_1$ and the resistor $R_1$. Since a bias for turning on the discharge switch $SW_{discharge}$ is not sufficiently applied between the emitter and the base thereof, the discharge switch $SW_{discharge}$ is not turned on when the tank capacitor $C_{tank}$ is being charged.

When the lower floating switch $IGBT_L$ is turned off, the charge current $i_{charge}$ does not flow any further and thus the bootstrap diode $D_{boot}$ is not in a conducting state.

When the low floating switch $IGBT_L$ is turned off, energy stored in the tank capacitor $C_{tank}$ is discharged through the discharge path shown as a dash-dotted line. Upon the discharging, the voltage $V_{tank}$, which has been charged in the tank capacitor $C_{tank}$, close to the input DC voltage $V_{dc}$ is applied to the emitter of the discharge switch $SW_{discharge}$, and an electric potential at a common node is applied to the base of the discharge switch $SW_{discharge}$ through the resistor R2, such that the discharge switch $SW_{discharge}$ is turned on to form the discharge path.

As the tank capacitor $C_{tank}$ is discharged, the charge current $i_{charge}$ is supplied to the negative voltage generation capacitor $C_{negative}$ to generate the negative voltage $V_{negative}$. Upon the discharging, in order to prevent the rush current impulse from being supplied to the negative voltage generation capacitor $C_{negative}$, a discharge resistor $R_{discharge}$ is provided to limit a discharge current $i_{discharge}$ supplied from the tank capacitor $C_{tank}$. The discharge current $i_{discharge}$ forms the discharge path by feeding back to the tank capacitor $C_{tank}$ through a discharge diode $D_{discharge}$.

The negative voltage generation capacitor $C_{negative}$ is charged by the negative voltage $V_{negative}$ by receiving the charge current $i_{charge}$ through one end thereof connected to the common node, and then provides the negative voltage $V_{negative}$ through the other end thereof. The negative voltage $V_{negative}$ from the negative voltage generator 200 is provided together with the positive voltage $V_{positive}$ to a gate driver 300 for driving the floating switches $IGBT_H$ and $IGBT_L$. The negative voltage $V_{negative}$ forms a voltage margin for a control voltage to be provided to a gate so as to prevent the upper floating switch $IGBT_H$ from unintendedly being turned on and off due to a parasitic oscillation.

In accordance with the present embodiment, unintended turn-on and turn-off of the upper floating switch $IGBT_H$ due to a parasitic oscillation may be prevented by applying the negative voltage $V_{negative}$ to the control terminal of the upper floating switch $IGBT_H$ when the lower floating switch $IGBT_L$ is turned off. Therefore, there is no need to use an SMPS circuit as a negative power source and a Miller clamp circuit so as to turn off the floating switches $IGBT_H$ and $IGBT_L$, such that an advantage of implementing the gate driver in a cost-effective manner may be provided.

Although the exemplary of implementing the upper floating switch $IGBT_H$ and the lower floating switch $IGBT_L$ by the IGBT is shown in the present embodiment, this may be merely one example, and thus upper and lower floating switches may be implemented by a metal oxide semiconductor field effect transistor (MOSFET). Furthermore, although the discharge switch $SW_{discharge}$ is implemented by a PNP bipolar junction transistor (BJT), this may be merely one example, and thus the discharge switch $SW_{discharge}$ may be implemented by one of various semiconductor switches.

Example of Simulation

Figure 2:
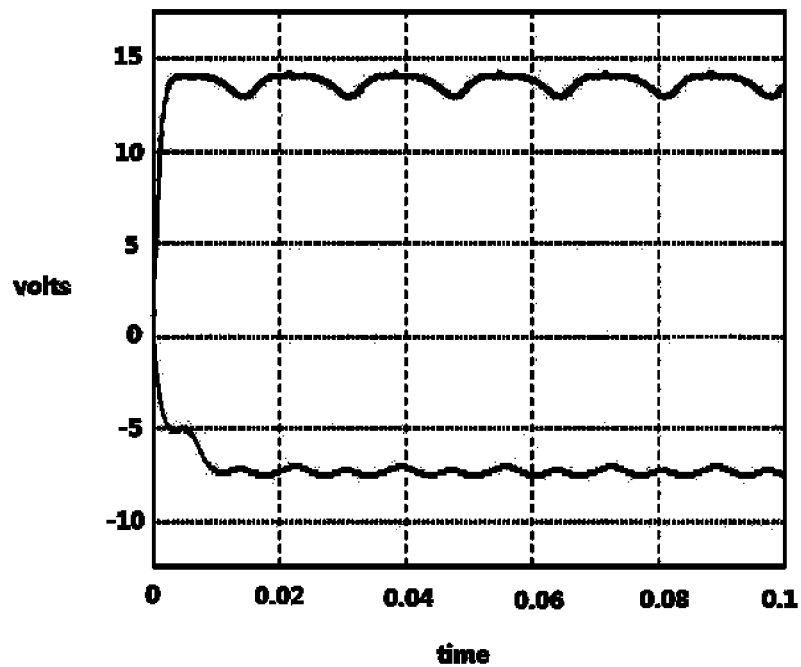
FIG. 2 is a diagram illustrating a computer simulation result regarding the power supply circuit for the gate driver of the floating switch according to the embodiment of the present invention.

FIG. 2 is a diagram illustrating an example of a computer simulation regarding the power supply circuit for the gate driver of the floating switch according to the present embodiment of the present invention. DC 15 volts (V) is supplied as the input DC voltage $V_{dc}$, and a capacitor of 47 micro-farads (μF) is used as the tank capacitor $C_{tank}$. As can be seen from FIG. 2, the positive voltage $V_{positive}$ is generated close to 15 V and also the negative voltage $V_{negative}$ is generated close to −7V.

While the foregoing invention has been described with reference to the above-described embodiments, various modifications and changes can be made without departing from the spirit of the invention. Accordingly, all such modifications and changes are considered to be within the scope of the appended claims. Accordingly, the specification and the drawings are to be regarded in an illustrative rather than a restrictive sense. The accompanying drawings that form a part hereof show, by way of illustration and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This detailed description, therefore, is not to be taken in a limiting sense, and the scope of various embodiments is defined only by the appended claims, along with the full range of equivalents to which such claims are entitled.

What is claimed is:

1. A power supply circuit for a gate driver, comprising:
a negative voltage generator configured to generate a negative voltage by receiving an input voltage, and comprising:
a tank capacitor configured to be charged by receiving the input voltage through a charge path;
a discharge switch configured to form a discharge path in response to the tank capacitor being discharged;
a negative voltage generation capacitor arranged on the discharge path and configured to generate the negative voltage by storing electric charges discharged from the tank capacitor in response to the tank capacitor being discharged; and
a discharge diode arranged on the discharge path and configured to be in a conducting state in response to the tank capacitor being discharged through the discharge path.

2. The power supply circuit of claim 1, wherein the charge path comprises:
the tank capacitor;
a charge diode configured to be in a conducting state in response to the tank capacitor being charged through the charge path; and
a second resistor configured to limit a current for charging the tank capacitor.

3. The power supply circuit of claim 1, wherein the discharge path comprises:
the discharge switch;
the negative voltage generation capacitor;
the discharge diode; and
a discharge resistor configured to limit a current for charging the negative voltage generation capacitor.

4. The power supply circuit of claim 1, wherein the discharge switch is configured to be turned off in response to the input voltage applied to a control terminal and a first terminal in response to the tank capacitor being charged, and is configured to be turned on to form the discharge path in response to a voltage, which is charged in the tank capacitor, applied to the first terminal and in response to a voltage at a common node applied to the control terminal in response to the tank capacitor being discharged.

5. The power supply circuit of claim 1, wherein the negative voltage generation capacitor is equipped with a first terminal and a second terminal, and is configured to be charged by receiving a current supplied through the first terminal in response to the tank capacitor being discharged to provide the negative voltage through the second terminal.

6. The power supply circuit of claim 1, wherein the negative voltage is configured to be applied to a gate driver of a floating switch to control the floating switch to be turned off, and the power supply circuit is included in the gate driver of the floating switch.

7. The power supply circuit of claim 6, wherein the floating switch is one of an insulated gate bipolar transistor (IGBT) and a metal oxide semiconductor field effect transistor (MOSFET).

8. The power supply circuit of claim 1, further comprising:
a positive voltage generator configured to generate a positive voltage by receiving the input voltage, and comprising:
a positive voltage generation capacitor configured to generate the positive voltage; and
a first resistor configured to limit a current in response to the positive voltage generation capacitor being charged.

9. A gate driver circuit of a floating switch, comprising:
a gate driver configured to drive a gate of the floating switch; and
a power supply circuit configured to provide power supply to the gate driver, and comprising:
a positive voltage generator configured to generate a positive voltage by receiving an input voltage; and
a negative voltage generator configured to generate a negative voltage by receiving the input voltage, and comprising:
a tank capacitor configured to be charged by receiving the input voltage;
a discharge switch configured to form a discharge path in response to the tank capacitor being discharged;
a negative voltage generation capacitor configured to generate the negative voltage by storing electric charges discharged from the tank capacitor in response to the tank capacitor being discharged; and a discharge diode arranged on the discharge path and configured to be in a conducting state in response to the tank capacitor being discharged through the discharge path.

10. The gate driver circuit of the floating switch of claim 9, wherein:
the tank capacitor is charged through a charge path; and
the charge path comprises:
the tank capacitor;
a charge diode configured to be in a conducting state in response to the tank capacitor being charged through the charge path; and
a second resistor configured to limit a current for charging the tank capacitor.

11. The gate driver circuit of the floating switch of claim 9, wherein the discharge path comprises:
the discharge switch;
the negative voltage generation capacitor;
the discharge diode; and
a discharge resistor configured to limit a current for charging the negative voltage generation capacitor.

12. The gate driver circuit of the floating switch of claim 9, wherein the discharge switch is configured to be turned off in response to the input voltage applied to a control terminal and a first terminal in response to the tank capacitor being charged, and is configured to be turned on to form a discharge path in response to a voltage, which is charged in the tank capacitor, applied to the first terminal and in response to a voltage at a common node applied to the control terminal in response to the tank capacitor being discharged.

13. The gate driver circuit of the floating switch of claim 9, wherein the negative voltage generation capacitor is equipped with a first terminal and a second terminal, and is configured to be charged by receiving a current supplied through the first terminal in response to the tank capacitor being discharged to provide the negative voltage through the second terminal.

14. The gate driver circuit of the floating switch of claim 9, wherein the floating switch is one of an insulated gate bipolar transistor (IGBT) and a metal oxide semiconductor field effect transistor (MOSFET).

15. The gate driver circuit of the floating switch of claim 9, wherein the negative voltage is configured to be applied to the gate driver of the floating switch to control the floating switch to be turned off.

16. A power supply circuit for a gate driver, comprising:
a negative voltage generator configured to generate a negative voltage by receiving an input voltage,
wherein the negative voltage generator includes:
a tank capacitor configured to be charged by receiving the input voltage through a charge path;
a discharge switch configured to form a discharge path when the tank capacitor is discharged; and
a negative voltage generation capacitor arranged on the discharge path and configured to generate the negative voltage by storing electric charges discharged from the tank capacitor when the tank capacitor is discharged,
wherein the discharge path includes:
the discharge switch;
the negative voltage generation capacitor;
a discharge diode configured to be in a conducting state when the tank capacitor is discharged through the discharge path; and
a discharge resistor configured to limit a current for charging the negative voltage generation capacitor.

* * * * *